United States Patent
Hattori et al.

(10) Patent No.: US 10,778,264 B2
(45) Date of Patent: Sep. 15, 2020

(54) TRANSMITTER, COMMUNICATION SYSTEM, CONTROL METHOD, AND PROGRAM

(71) Applicant: NEC Corporation, Minato-ku, Tokyo (JP)

(72) Inventors: Wataru Hattori, Tokyo (JP); Masaaki Tanio, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/483,467

(22) PCT Filed: Feb. 8, 2017

(86) PCT No.: PCT/JP2017/004519
§ 371 (c)(1),
(2) Date: Aug. 5, 2019

(87) PCT Pub. No.: WO2018/146741
PCT Pub. Date: Aug. 16, 2018

(65) Prior Publication Data
US 2020/0014412 A1    Jan. 9, 2020

(51) Int. Cl.
*H04B 1/04* (2006.01)
*H04B 1/00* (2006.01)
*H04B 1/40* (2015.01)
*H04B 7/0417* (2017.01)

(52) U.S. Cl.
CPC ......... *H04B 1/0475* (2013.01); *H04B 1/0071* (2013.01); *H04B 1/40* (2013.01); *H04B 7/0417* (2013.01); *H04B 2001/0491* (2013.01)

(58) Field of Classification Search
CPC ...... H04B 1/0475; H04B 7/0417; H04B 1/40; H04B 1/0071; H04B 2001/0491; H04B 1/04; H03F 1/32
See application file for complete search history.

(56) References Cited

U.S. PATENT DOCUMENTS

2012/0281777 A1* 11/2012 Ho ................. H03F 1/3247
375/267
2013/0049858 A1* 2/2013 Wimpenny ........... H03F 1/0222
330/84
(Continued)

FOREIGN PATENT DOCUMENTS

JP    2006140785 A    6/2006
JP    2010041470 A    2/2010
(Continued)

OTHER PUBLICATIONS

Ma, Yeulin, et al., "Wideband Digital Predistortion Using Spectral Extrapolation of Band-Limited Feedback Signal", IEEE Transactions on Circuits and Systems-I: Regular Papers, vol. 61, No. 7, Jul. 2014, pp. 2088-2097.
(Continued)

*Primary Examiner* — Kenneth T Lam

(57) ABSTRACT

A transmitter includes a plurality of transmitter circuits configured to generate signals that are within the same frequency band; and a feedback circuit that is shared by the plurality of transmitter circuits, the feedback circuit being configured to feed back a part of a transmission amplification signal to a transmitter circuit, the transmission amplification signal being output from each of the plurality of transmitter circuits through a transmission amplifier, and the transmitter circuit being configured to output the transmission amplification signal among the plurality of transmitter circuits. The feedback circuit includes a frequency selective extraction unit configured to extract different-band signals in frequency bands from the transmission amplification signal, the frequency bands being different from each other, a synthesis unit configured to synthesize the different-band signals extracted by the frequency selective extraction unit, and to generate a synthesis signal, a frequency conversion unit configured to frequency-convert the synthesis signal generated by the synthesis unit by using a local signal of the
(Continued)

same frequency, the local signal being common to a plurality of transmission paths, and a distortion compensation coefficient calculation unit configured to calculate a distortion compensation coefficient based on signals of frequency bands of the different-band signals, the distortion compensation coefficient being used when compensating for distortion of signals in outputs of the plurality of transmitter circuits.

8 Claims, 13 Drawing Sheets

(56) References Cited

U.S. PATENT DOCUMENTS

| 2016/0226698 | A1* | 8/2016 | Yamanouchi | H03F 3/24 |
| 2017/0279470 | A1* | 9/2017 | Lee | H04B 1/04 |
| 2018/0167092 | A1* | 6/2018 | Hausmair | H04L 25/03343 |
| 2019/0052235 | A1* | 2/2019 | Seo | H03F 3/19 |
| 2019/0280730 | A1* | 9/2019 | Zhang | H04L 1/243 |

FOREIGN PATENT DOCUMENTS

| JP | 2012129870 A | 7/2012 |
| JP | 2013046365 A | 3/2013 |
| WO | 2013118367 A1 | 8/2013 |

OTHER PUBLICATIONS

International Search Report dated May 9, 2017 from the International Bureau in counterpart International application No. PCT/JP2017/004519.

* cited by examiner

TRANSMITTER, COMMUNICATION SYSTEM, CONTROL METHOD, AND PROGRAM

This application is a National Stage Entry of PCT/JP2017/004519 filed on Feb. 8, 2017, the contents of all of which are incorporated herein by reference, in their entirety.

TECHNICAL FIELD

The present invention relates to a transmitter, a communication system, a control method, and a program.

BACKGROUND ART

With the spread of radio communication systems such as mobile communication systems, higher performance of a transceiver has been demanded. Particularly, among such higher performance of a transmitter, low power consumption and low distortion have been demanded. In addition, among such another higher performance of a transmitter, an increase in data communication speed has been demanded.

As a related technology, with regard to a transmitter which includes a plurality of transmission paths and in which frequency bands of radio frequency (RF) signals in outputs of the transmission paths are different from each other, Patent Document 1 and Patent Document 2 disclose a technology of correcting distortion of signals in the outputs of transmission paths.

As a related technology, Patent Document 3 discloses a technology of correcting distortion of signals in outputs of transmission paths of a transmitter using a multiple-input multiple-output (MIMO) transmission technology, and of reducing a circuit scale in the transmitter.

CITATION LIST

Patent Literature

[Patent Document 1]
  International Publication No. 2013/118367
[Patent Document 2]
  Japanese Unexamined Patent Application, First Publication No. 2012-129870
[Patent Document 3]
  Japanese Unexamined Patent Application, First Publication No. 2013-046365

SUMMARY OF INVENTION

Technical Problem

On the other hand, an MIMO transmission technology is means for realizing high-speed data communication by using a plurality of antennas and transmitter and receiver circuits. A transmitter using the MIMO transmission technology includes a plurality of transmission paths. In addition, in a transmitter using the MIMO transmission technology, frequency bands of RF signals in outputs of the transmission paths are the same as each other. Accordingly, differently from a distortion compensation technology of a transmitter including a plurality of transmission paths in which frequency bands of RF signals are different from each other as disclosed in Patent Document 1 and Patent Document 2, in a distortion compensation technology of a transmitter using the MIMO transmission technology, it is necessary to provide a configuration capable of multiplexing feed-back signals and separating the feed-back signals to sufficiently take isolation of the feed-back signals in outputs of respective transmission paths.

In addition, in a transmitter which includes a plurality of transmission paths, which can realize high-speed data communication in which frequency bands of RF signals in outputs of the respective transmission paths are the same as each other, and which can correct distortion of signals in the outputs of the respective transmission paths, further reductions in circuit scale are demanded.

An object of the invention is to provide a transmitter, a communication system, a control method, and a program which are capable of solving the above-described problem.

Solution to Problem

To accomplish the object, according to an exemplary aspect of the invention there is provided a transmitter including: a plurality of transmitter circuits configured to generate signals that are within the same frequency band; and a feedback circuit that is shared by the plurality of transmitter circuits, the feedback circuit being configured to feed back a part of a transmission amplification signal to a transmitter circuit, the transmission amplification signal being output from each of the plurality of transmitter circuits through a transmission amplifier, and the transmitter circuit being configured to output the transmission amplification signal among the plurality of transmitter circuits. The feedback circuit includes a frequency selective extraction unit configured to extract different-band signals in frequency bands from the transmission amplification signal, the frequency bands being different from each other, a synthesis unit configured to synthesize the different-band signals extracted by the frequency selective extraction unit, and to generate a synthesis signal, a frequency conversion unit configured to frequency-convert the synthesis signal generated by the synthesis unit by using a local signal of the same frequency, the local signal being common to a plurality of transmission paths, and a distortion compensation coefficient calculation unit configured to calculate a distortion compensation coefficient based on signals of frequency bands of the different-band signals, the distortion compensation coefficient being used when compensating for distortion of signals in outputs of the plurality of transmitter circuits.

In addition, according to another exemplary aspect of the invention, there is provided a transceiver including: a housing; the transmitter; and a receiver configured to receive a transmission amplification signal that is transmitted from a communication device different from the transmitter. The transmitter and the receiver are accommodated in the housing.

In addition, according to still another exemplary aspect of the invention, there is provided a communication system including: the transmitter; and a receiver configured to receive a transmission amplification signal that is transmitted from the transmitter.

In addition, according to still another exemplary aspect of the invention, there is provided a communication system including: one or more of the transceivers; and a communication device configured to execute at least any one of: receiving of a transmission amplification signal transmitted from the transceiver; and transmission of the transmission amplification signal to the transceiver.

In addition, according to still another exemplary aspect of the invention, there is provided a control method of a transmitter. The method includes: generating signals that are within the same frequency band; feeding back a part of a transmission amplification signal to a transmitter circuit, the transmission amplification signal being output from each of the plurality of transmitter circuits through a transmission amplifier, and the transmitter circuit being configured to output the transmission amplification signal among the plurality of transmitter circuits; extracting different-band signals of frequency bands from the transmission amplification signal, the frequency bands being different from each other; synthesizing the extracted different-band signals and generating a synthesis signal; frequency-converting the synthesis signal that is generated by using a local signal of the same frequency, the local signal being common to a plurality of transmission paths; and calculating a distortion compensation coefficient based on signals of frequency bands of the different-band signals, the distortion compensation coefficient being used when compensating for distortion of signals in outputs of the plurality of transmitter circuits.

In addition, according to still another exemplary aspect of the invention, there is provided a control method of a transceiver. The method includes: generating signals that are within the same frequency band; feeding back a part of a transmission amplification signal to a transmitter circuit, the transmission amplification signal being output from each of the plurality of transmitter circuits through a transmission amplifier, and the transmitter circuit being configured to output the transmission amplification signal among the plurality of transmitter circuits; extracting different-band signals of frequency bands from the transmission amplification signal, the frequency bands being different from each other; synthesizing the extracted different-band signals and generating a synthesis signal; frequency-converting the synthesis signal that is generated by using a local signal of the same frequency, the local signal being common to a plurality of transmission paths; calculating a distortion compensation coefficient based on signals of frequency bands of the different-band signals, the distortion compensation coefficient being used when compensating for distortion of signals in outputs of the plurality of transmitter circuits; and receiving a communication signal different from the transmission amplification signal.

In addition, according to still another exemplary aspect of the invention, there is provided a program that causes a computer of a transmitter including a plurality of transmission paths to execute: generating signals that are within the same frequency band; feeding back a part of a transmission amplification signal to a transmitter circuit, the transmission amplification signal being output from each of the plurality of transmitter circuits through a transmission amplifier, and the transmitter circuit being configured to output the transmission amplification signal among the plurality of transmitter circuits; extracting different-band signals of frequency bands from the transmission amplification signal, the frequency bands being different from each other; synthesizing the extracted different-band signals and generating a synthesis signal; frequency-converting the synthesis signal that is generated by using a local signal of the same frequency, the local signal being common to a plurality of transmission paths; and calculating a distortion compensation coefficient based on signals of frequency bands of the different-band signals, the distortion compensation coefficient being used when compensating for distortion of signals in outputs of the plurality of transmitter circuits.

In addition, according to still another exemplary aspect of the invention, there is provided a program that causes a computer of a transceiver including a plurality of transmission paths to execute: generating signals that are within the same frequency band; feeding back a part of a transmission amplification signal to a transmitter circuit, the transmission amplification signal being output from each of the plurality of transmitter circuits through a transmission amplifier, and the transmitter circuit being configured to output the transmission amplification signal, among the plurality of transmitter circuits; extracting different-band signals of frequency bands from the transmission amplification signal, the frequency bands being different from each other; synthesizing the extracted different-band signals and generating a synthesis signal; frequency-converting the synthesis signal that is generated by using a local signal of the same frequency, the local signal being common to a plurality of transmission paths; calculating a distortion compensation coefficient based on signals of frequency bands of the different-band signals, the distortion compensation coefficient being used when compensating for distortion of signals in outputs of the plurality of transmitter circuits; and receiving a communication signal different from the transmission amplification signal.

Advantageous Effects of Invention

According to the exemplary aspects of the invention, in a transmitter which includes a plurality of transmission paths and in which frequency bands of RF signals in outputs of respective transmission paths are the same as each other, it is possible to reduce a circuit scale.

DESCRIPTION OF EXEMPLARY EMBODIMENTS

First Exemplary Embodiment

Hereinafter, exemplary embodiments will be described in detail with reference to the accompanying drawings.

A configuration and processing of a transmitter 1 according to a first exemplary embodiment of the invention will be described.

Figure 1:
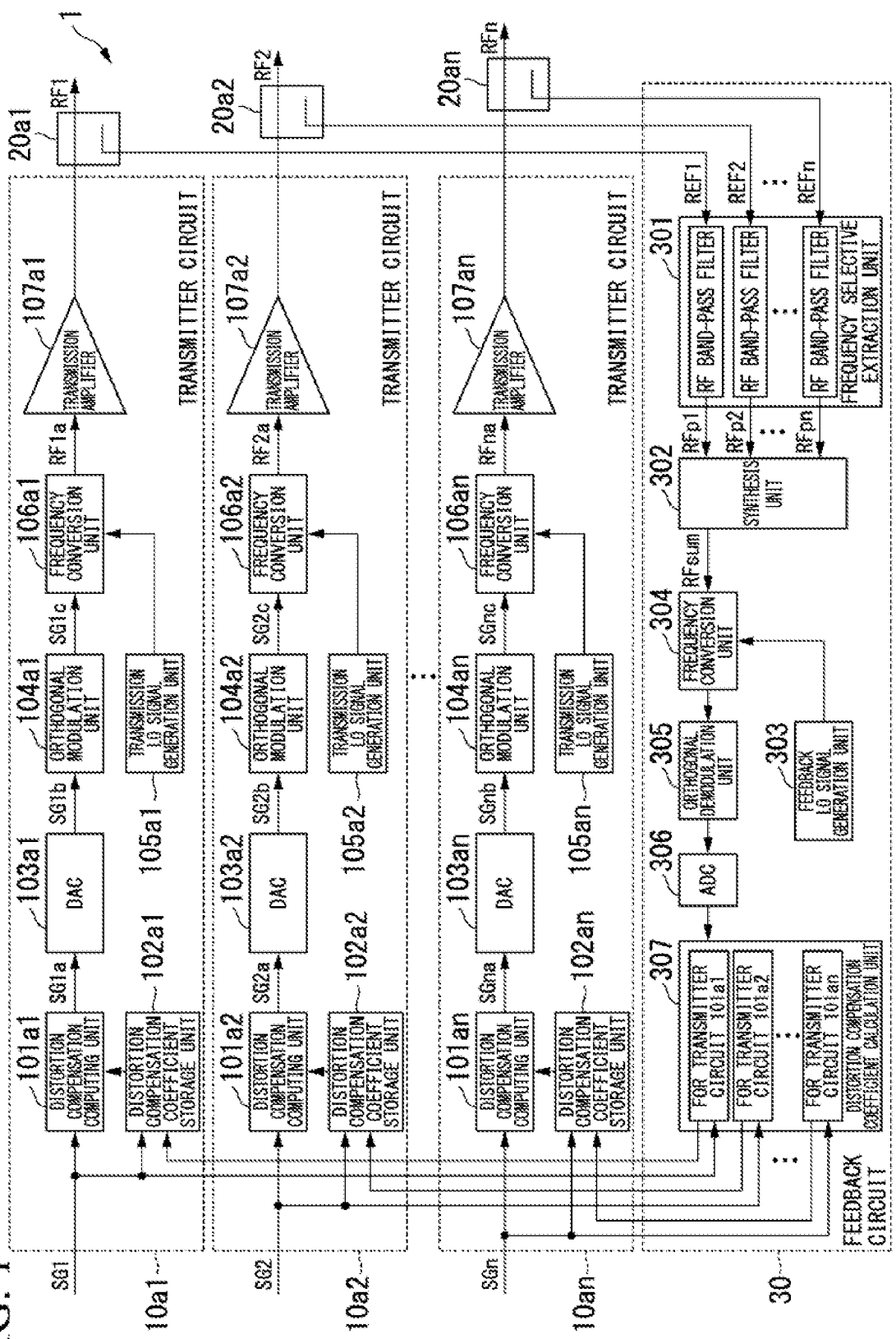
FIG. 1 is a view showing a configuration of a transmitter according to a first exemplary embodiment of the invention.

The transmitter 1 according to the first exemplary embodiment of the invention is a transmitter including a plurality of transmission paths, is capable of realizing high-speed data communication in which frequency bands of RF signals in outputs of the transmission paths are the same as each other, and is capable of correcting distortion of signals in the outputs of the transmission paths. As shown in FIG. 1, the transmitter 1 includes transmitter circuits 10a1, 10a2, . . . , and 10an, signal branching units 20a1, 20a2, . . . , and 20an, and a feedback circuit 30.

Note that the transmitter circuits 10a1, 10a2, . . . , and 10an are collectively referred to as a transmitter circuit 10a.

In addition, the signal branching units 20a1, 20a2, . . . , and 20an are collectively referred to a signal branching unit 20a.

The transmitter circuit 10a1 is a circuit that converts a transmission signal SG1 of a first transmission path among a plurality of first to $n^{th}$ transmission paths into an RF signal RF1, and transmits the RF signal RF1.

The transmitter circuit 10a1 includes a distortion compensation computing unit 101a1, a distortion compensation coefficient storage unit 102a1, a digital to analog converter (DAC) 103a1, an orthogonal modulation unit 104a1, a transmission local (LO) signal generation unit 105a1, a frequency conversion unit 106a1, and a transmission amplifier 107a1.

The transmitter circuit 10a2 is a circuit that converts a transmission signal SG2 of a second transmission path among the plurality of first to $n^{th}$ transmission paths into an RF signal RF2, and transmits the RF signal RF2.

The transmitter circuit 10a2 includes a distortion compensation computing unit 101a2, a distortion compensation coefficient storage unit 102a2, a DAC 103a2, an orthogonal modulation unit 104a2, a transmission LO signal generation unit 105a2, a frequency conversion unit 106a2, and a transmission amplifier 107a2.

The transmitter circuit 10an is a circuit that converts a transmission signal SGn of an $n^{th}$ transmission path among the plurality of first to $n^{th}$ transmission paths into an RF signal RFn, and transmits the RF signal RFn.

The transmitter circuit 10an includes a distortion compensation computing unit 101an, a distortion compensation coefficient storage unit 102an, a DAC 103an, an orthogonal modulation unit 104an, a transmission LO signal generation unit 105an, a frequency conversion unit 106an, and a transmission amplifier 107an.

Note that the distortion compensation computing units 101a1, 101a2, . . . , and 101an are collectively referred to as a distortion compensation computing unit 101a.

In addition, the distortion compensation coefficient storage units 102a1, 102a2, . . . , and 102an are collectively referred to as a distortion compensation coefficient storage unit 102a.

In addition, the DACs 103a1, 103a2, . . . , and 103an are collectively referred to as a DAC 103a.

In addition, the orthogonal modulation units 104a1, 104a2, . . . , and 104an are collectively referred to as an orthogonal modulation unit 104a.

In addition, the transmission LO signal generation units 105a1, 105a2, . . . , and 105an are collectively referred to as a transmission LO signal generation unit 105a.

In addition, the frequency conversion units 106a1, 106a2, . . . , and 106an are collectively referred to as a frequency conversion unit 106a.

In addition, the transmission amplifiers 107a1, 107a2, . . . , and 107an are collectively referred to as a transmission amplifier 107a.

Each of the distortion compensation computing units 101a reads a distortion compensation coefficient corresponding to electric power of a transmission signal that is handled by the transmitter circuit 10a including the distortion compensation computing unit 101a from the distortion compensation coefficient storage unit 102a. The distortion compensation computing unit 101a performs distortion compensation computation with respect to the transmission signal by using the read distortion compensation coefficient to compensate for the distortion in a transmission path.

Specifically, for example, in a case where the distortion compensation computing unit 101a is the distortion compensation computing unit 101a2, the distortion compensation computing unit 101a2 reads a distortion compensation coefficient corresponding to electric power of a transmission signal SG2 that is handled by the transmitter circuit 10a2 including the distortion compensation computing unit 101a2 from the distortion compensation coefficient storage unit 102a2. The distortion compensation computing unit 101a2 performs distortion compensation computation with respect to the transmission signal SG2 by using the read distortion compensation coefficient to compensate for distortion in a second transmission path.

Each of the distortion compensation coefficient storage units 102a stores a distortion compensation coefficient corresponding to electric power of a transmission signal that is handled by the transmitter circuit 10a including the distortion compensation coefficient storage unit 102a.

Specifically, for example, in a case where the distortion compensation coefficient storage unit 102a is the distortion compensation coefficient storage unit 102a2, the distortion compensation coefficient storage unit 102a2 stores the distortion compensation coefficient corresponding to the electric power of the transmission signal SG2 that is handled by the transmitter circuit 10a2 including the distortion compensation coefficient storage unit 102a2.

Note that the distortion compensation coefficient is updated by a distortion compensation coefficient calculation unit 307 as will be described later.

Each of the DACs 103a converts a transmission signal after distortion compensation computation by the distortion compensation computing unit 101a from digital to analog, and is configured to generate an orthogonal baseband signal.

Specifically, for example, in a case where the DAC 103a is the DAC 103a2, the DAC 103a2 converts a transmission signal SG2a after distortion compensation computation by the distortion compensation computing unit 101a2 from digital to analog, and is configured to generate an orthogonal baseband signal SG2b in the second transmission path.

Each of the DACs 103a outputs the orthogonal baseband signal that is generated to the orthogonal modulation unit 104a in a next stage.

Each of the orthogonal modulation units 104a converts the orthogonal baseband signal received from the DAC 103a into a modulation signal.

Specifically, for example, in a case where the orthogonal modulation unit 104a is the orthogonal modulation unit 104a2, the orthogonal modulation unit 104a2 converts the orthogonal baseband signal SG2b received from the DAC 103a2 into a modulation signal SG2c in the second transmission path.

Each of the orthogonal modulation units 104a outputs the modulation signal to the frequency conversion unit 106a in a next stage.

Each of the transmission LO signal generation units 105a generates a transmission LO signal. A plurality of the transmission LO signals are signals which cause frequency bands of RF signals in outputs of respective transmission paths to be the same as each other. For example, in a case where configurations of the respective transmission paths are the same as each other, the transmission LO signals in the respective transmission paths are transmission LO signals of the same frequency. However, even in a case where the configurations of the respective transmission paths are different from each other, the transmission LO signals in the respective transmission paths may be signals which cause frequency bands of RF signals in outputs of the respective transmission path to be the same as each other.

Each of the transmission LO signal generation units 105a outputs the transmission LO signal that is generated to the frequency conversion unit 106a in a next stage.

Specifically, for example, in a case where the transmission LO signal generation unit 105a is the transmission LO signal generation unit 105a2, the transmission LO signal generation unit 105a2 generates a transmission LO signal in the second transmission path. The transmission LO signal generation unit 105a2 output the transmission LO signal that is generated to the frequency conversion unit 106a2.

Each of the frequency conversion units 106a performs frequency conversion of the modulation signal received from the orthogonal modulation unit 104a by using the transmission LO signal received from the transmission LO signal generation unit 105a, and is configured to generate an RF signal.

Specifically, in a case where the frequency conversion unit 106a is the frequency conversion unit 106a2, the frequency conversion unit 106a2 performs frequency conversion of the modulation signal SG2c, which is received from the orthogonal modulation unit 104a2, in the second transmission path by using the transmission LO signal received from the transmission LO signal generation unit 105a2, and is configured to generate an RF signal RF2a.

Each of the frequency conversion units 106a outputs the RF signal that is generated to the transmission amplifier 107a in a next stage.

Each of the transmission amplifiers 107a amplifies the RF signal that is received from the frequency conversion unit 106a. The transmission amplifier 107a outputs the RF signal after amplification to the receiver 2.

Specifically, in a case where the transmission amplifier 107a is the transmission amplifier 107a2, the transmission amplifier 107a2 amplifies the RF signal RF2a that is received from the frequency conversion unit 106a2. The transmission amplifier 107a2 transmits the RF signal RF2 after amplification to the receiver 2.

For example, each of the signal branching units 20a is a directional coupler.

The signal branching unit 20a branches a part of the RF signal after amplification by the transmission amplifier 107a of the transmitter circuit 10a including the signal branching unit 20a, and outputs the part of the RF signal to the feedback circuit 30 as an RF signal for reference.

Specifically, in a case where the signal branching unit 20a is the signal branching unit 20a2, the signal branching unit 20a2 branches a part of the RF signal RF2 after amplification by the transmission amplifier 107a2 of the transmitter circuit 10a2, and outputs the part of the RF signal RF2 to the feedback circuit 30 as an RF signal REF2 for reference.

The feedback circuit 30 is a circuit that feeds back the RF signal after amplification by the transmission amplifier 107a to each of the distortion compensation computing units 101a to compensate for distortion of the RF signal which mainly occurs in the transmission amplifier 107a.

As shown in FIG. 1, the feedback circuit 30 includes a frequency selective extraction unit 301, a synthesis unit 302, a feedback LO signal generation unit 303, a frequency conversion unit 304, an orthogonal demodulation unit 305, an analog to digital converter (ADC) 306, and a distortion compensation coefficient calculation unit 307.

The frequency selective extraction unit 301 selectively extracts only a frequency band of a corresponding transmission path with respect to RF signals in the first to $n^{th}$ transmission path.

Figure 2:
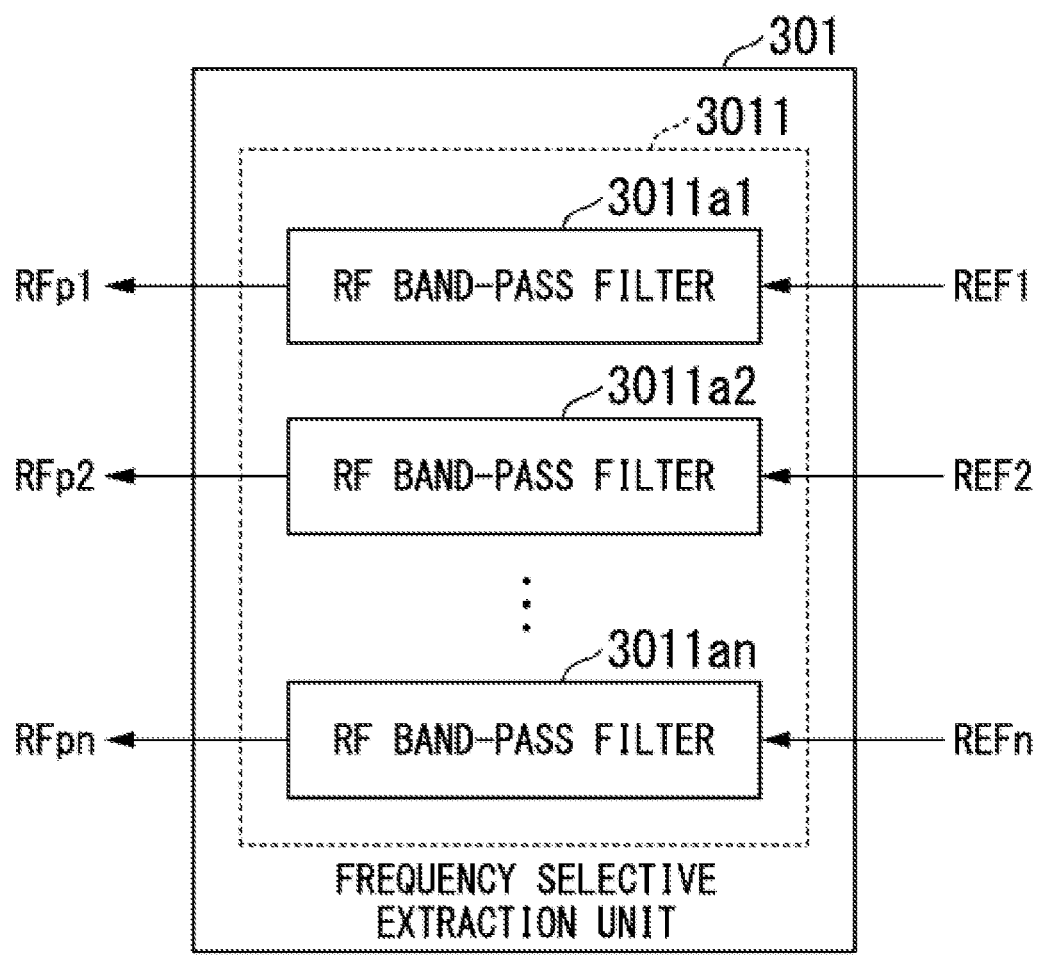
FIG. 2 is a view showing a frequency selective extraction unit according to the first exemplary embodiment of the invention.

Specifically, as shown in FIG. 2, the frequency selective extraction unit 301 includes, for example, a filter bank 3011. The filter bank 3011 includes an array of RF band-pass filters 3011a1 to 3011an. The RF band-pass filters correspond to one-to-one to the first to $n^{th}$ transmission paths, and are filters that allow only a signal in a different frequency band of RF signals for every transmission path to pass therethrough. In addition, respective passing bands of the filters do not overlap each other. The filter bank 3011 allows RF signals REF1 to REFn for reference to pass therethrough to selectively extract a frequency component corresponding to a passing band of each of the RF band-pass filters.

Figure 3:
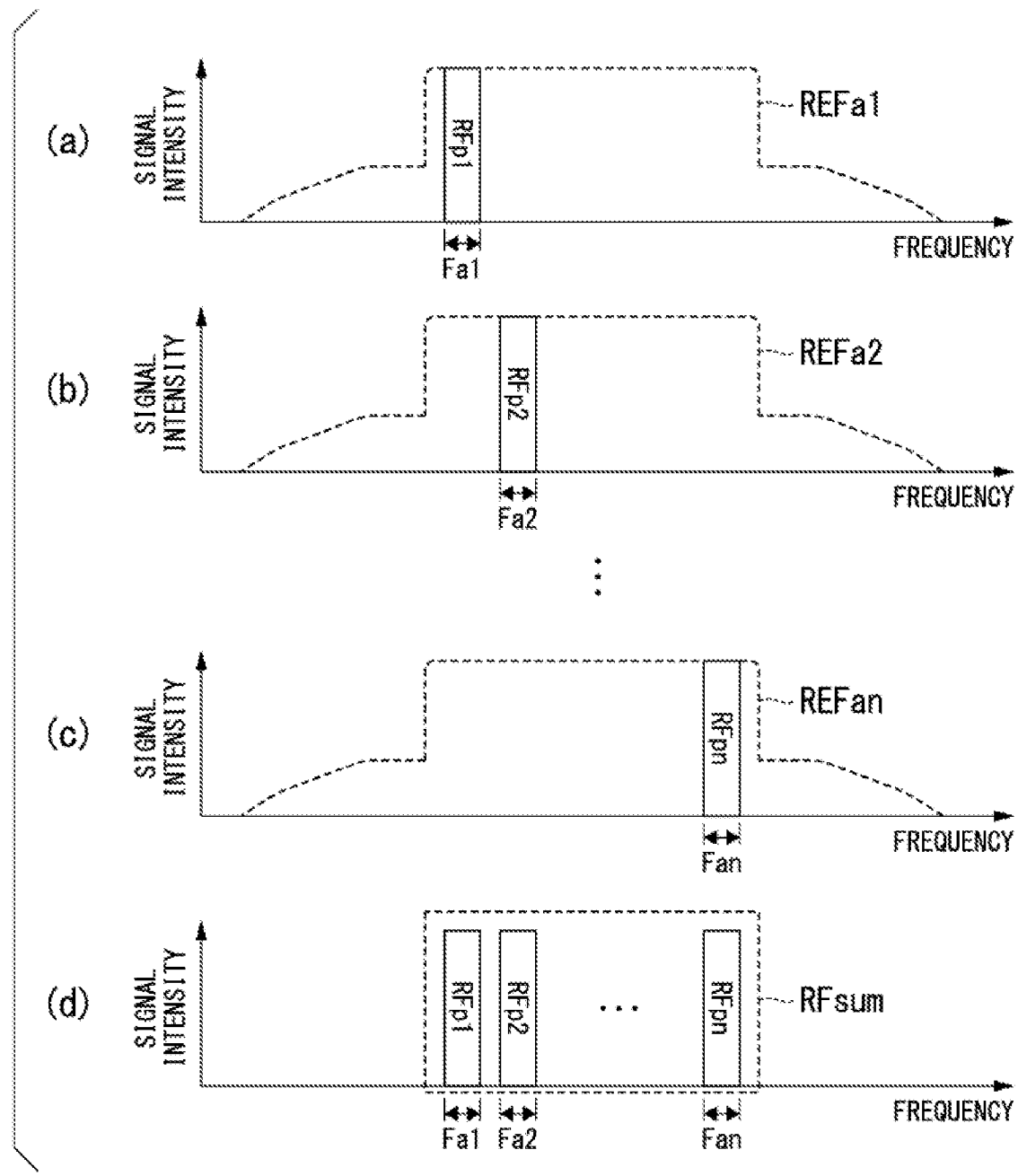
FIG. 3 is a first view showing the transmitter according to the first exemplary embodiment of the invention.

More specifically, when a passing band of the RF band-pass filter 3011a1 for the transmitter circuit 10a1 is set to a frequency band Fa1, as shown in a portion (a) of FIG. 3, the RF band-pass filter 3011a1 allows a signal RFp1 of a frequency component in the frequency band Fa1 to selectively pass therethrough. In addition, when the passing band of the RF band-pass filter 3011a2 for the transmitter circuit 10a2 is set to a frequency band Fa2, as shown in a portion (b) of FIG. 3, the RF band-pass filter 3011a2 allows a signal RFp2 of a frequency component in the frequency band Fa2 to selectively pass therethrough. Similarly, when the passing band of the RF band-pass filter 3011an for the transmitter circuit 10an is set to a frequency band Fan, as shown in a portion (c) of FIG. 3, the RF band-pass filter 3011an selectively allows a signal RFpn of a frequency component in the frequency band Fan to pass therethrough.

According to this, the frequency selective extraction unit 301 can selectively extract each signal of frequency components different from each other in respective frequency bands of the RF band-pass filter in the RF signals REF1 to REFn for reference, that is, each of the signals RFp1 to RFpn.

The frequency selective extraction unit 301 outputs each of the extracted signals of frequency components different from each other to the synthesis unit 302.

The synthesis unit 302 receives each of the signals of frequency components different from each other from the frequency selective extraction unit 301.

The synthesis unit 302 multiplexes the received signals of frequency components different from each other, and is configured to generate one RF signal RFsum.

Specifically, for example, in a case of receiving signals of frequency components shown in portions of (a) to (c) of FIG. 3 from the frequency selective extraction unit 301, the synthesis unit 302 multiplexes the received signals on a frequency axis, and is configured to generate an RF signal RFsum as shown in a portion (d) of FIG. 3.

The synthesis unit 302 outputs the RF signal RFsum (synthesis signal) that is generated to the frequency conversion unit 304.

The feedback LO signal generation unit 303 generates a feedback LO signal. The feedback LO signal is a signal that is used when the frequency conversion unit 304 generates a modulation signal.

The feedback LO signal generation unit 303 outputs the feedback LO signal that is generated to the frequency conversion unit 304.

The frequency conversion unit 304 receives the RF signal RFsum from the synthesis unit 302. In addition, the frequency conversion unit 304 receives the feedback LO signal from the feedback LO signal generation unit 303.

The frequency conversion unit 304 converts a frequency of the received RF signal RFsum by using the received feedback LO signal to generate a modulation signal.

The frequency conversion unit 304 outputs the modulation signal that is generated to the orthogonal demodulation unit 305.

The orthogonal demodulation unit 305 receives the modulation signal from the frequency conversion unit 304.

The orthogonal demodulation unit 305 converts the modulation signal that is received into an orthogonal baseband signal.

The orthogonal demodulation unit 305 outputs the orthogonal baseband signal to the ADC 306.

The ADC 306 receives the orthogonal baseband signal from the orthogonal demodulation unit 305.

The ADC 306 converts the orthogonal baseband signal that is received into a digital signal.

The ADC 306 outputs the digital signal to the distortion compensation coefficient calculation unit 307.

The distortion compensation coefficient calculation unit 307 receives the digital signal from the ADC 306. In addition, the distortion compensation coefficient calculation unit 307 receives the transmission signals SG1 to SGn.

The distortion compensation coefficient calculation unit 307 classifies the digital signals which are received for every frequency component that is extracted in the frequency selective extraction unit 301, that is, the distortion compensation coefficient calculation unit 307 classifies the RF signals RFp1 to RFpn to the RF signals REF1 to REFn for reference. The distortion compensation coefficient calculation unit 307 performs comparison with the received transmission signals SG1 to SGn set as a reference signal in a corresponding transmission path to calculate a distortion compensation coefficient of each of the transmitter circuits 10a.

At this time, when using a digital pre-distortion (DPD) algorithm that is represented by Yuelin Ma, Yasushi Yamao, Yoshihiko Akaiwa, Koji Ishibashi, "Wideband Digital Pre-distortion Using Spectral Extrapolation of Band-Limited Feedback Signal", IEEE Transactions ON Circuits and Systems I:Regular Papers, Volume:61, Issue:7, pp. 2088-2097, July 2014, it is possible to recover the entirety of transmission signals on the basis of the RF signals REF1 to REFn for reference of the frequency component extracted in the frequency selective extraction unit 301, and thus it is possible to calculate a distortion compensation coefficient with higher accuracy.

The distortion compensation coefficient calculation unit 307 rewrites a distortion compensation coefficient that is stored in each of the distortion compensation coefficient storage units 102a with the distortion compensation coefficient that is calculated.

Specifically, for example, in a case where the distortion compensation coefficient storage unit 102a is the distortion compensation coefficient storage unit 102a2, the distortion compensation coefficient storage unit 102a2 stores a distortion compensation coefficient corresponding to electric power of the transmission signal SG2 that is handled by the transmitter circuit 10a2 including the distortion compensation coefficient storage unit 102a2.

The transmitter 1 according to the first exemplary embodiment of the invention has been described.

The transmitter 1 according to the first exemplary embodiment of the invention is a transmitter which includes a plurality of transmission paths in which frequency bands of RF signals in outputs of the respective transmission paths are the same as each other. The transmitter 1 includes the plurality of transmitter circuits 10a which is configured to generate signals having the same frequency band, and the feedback circuit 30 that is shared by the plurality of transmitter circuits 10a, and is configured to feed back a part of a transmission amplification signal output from each of the plurality of transmitter circuits 10a through the transmission amplifier 107a to a corresponding transmitter circuit 10a, which is configured to output the transmission amplification signal, among the plurality of transmitter circuits 10a. The feedback circuit 30 includes the frequency selective extraction unit 301 that is configured to extract different-band signals in frequency bands different from each other of a transmission amplification signal, the synthesis unit 302 that is configured to synthesize the different-band signals extracted by the frequency selective extraction unit 301 to generate a synthesis signal, the frequency conversion unit 304 that is configured to frequency-convert the synthesis signal generated by the synthesis unit 302 into a baseband frequency band signal by using a feedback LO signal (local signal) that is common to respective transmission paths of the same frequency, and the distortion compensation coefficient calculation unit 307 that is configured to calculate a distortion compensation coefficient that is used when compensating for distortion of a signal in respective outputs of the plurality of transmitter circuits 10a on the basis of the different-band signals.

As described above, the shared feedback circuit 30 includes the frequency selective extraction unit 301 and the synthesis unit 302, and thus it is possible to multiplex the RF signals RF1 to RFn on a frequency without using another feedback LO signal.

In addition, the frequency conversion unit 304 collectively frequency-converts the RF signal RFsum obtained by multiplexing the RF signals RF1 to RFn on the frequency into a baseband frequency band signal. Accordingly, it is possible to use the feedback LO signal that is generated by the feedback LO signal generation unit 303 that is common to the respective transmission paths.

As a result, the single feedback LO signal generation unit 303 can be used, and thus in the transmitter 1 which includes the plurality of transmission paths and in which the frequency bands of the RF signals in outputs of the respective transmission paths are the same as each other, it is possible to reduce the cost, a circuit scale, and power consumption.

Note that each of the signals RFp1 to RFpn which are extracted by the frequency selective extraction unit 301 shown in FIG. 3 is shown in a rectangular shape for simplification. However, each of actual RF band-pass filters provided in the frequency selective extraction unit 301 extracts the signals RFp1 to RFpn in an approximately trapezoidal shape having an arbitrary slope.

Frequency characteristics of the actual RF band-pass filter provided in the frequency selective extraction unit 301 can be reflected in calculation of a distortion compensation coefficient in the distortion compensation coefficient calculation unit 307. However, when the signals RFp1 to RFpn are mixed in, separation thereof becomes difficult, and thus as shown in a portion (d) of FIG. 3, it is demanded to design a passing band and a blocking band of a filter in such a manner that each of the signals RFp1 to RFpn is sufficiently isolated in order for frequency intervals between the signals RFp1 to RFpn and guard bands to exist. Note that the guard bands are characteristics which are provided in the frequency selective extraction unit 301.

Figure 4:
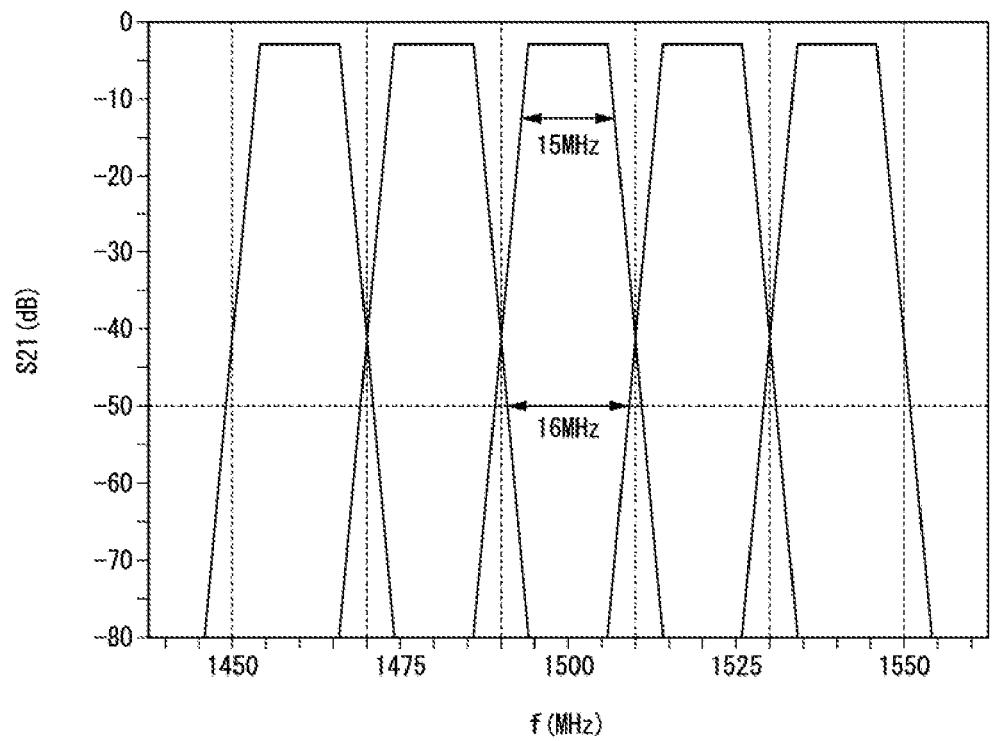
FIG. 4 is a second view showing the transmitter according to the first exemplary embodiment of the invention.

More specifically, for example, in a case where the frequency selective extraction unit 301 performs processing of dividing a signal band of 1450 to 1550 MHz into five parts (each having a width of 20 MHz), the frequency characteristics of the RF band-pass filter provided in the frequency selective extraction unit 301 become characteristics shown in FIG. 4 as an example. In a case where the frequency characteristics of the RF band-pass filter are characteristics shown in FIG. 4, a passing bandwidth of the RF band-pass filter may be set to, for example, 15 MHz in order for isolation between signals which pass through the RF band-pass filter to be 50 dB. At this time, the guard bands become 5 MHz. In addition, a bandwidth at which the isolation becomes 50 dB is 16 MHz. Note that the distortion compensation coefficient calculation unit 307 further extracts signals in the band of 15 MHz with a digital filter in accordance with the above-described configuration to calculate the distortion compensation coefficient.

In addition, a frequency component that is extracted from the RF signals REF1 to REFn for reference by the frequency selective extraction unit 301 is not limited to one component with respect to the RF signals REF1 to REFn for reference. With regard to the frequency component that is extracted from the RF signals REF1 to REFn for reference by the frequency selective extraction unit 301, for example, as shown in FIG. 5, a plurality of frequency components may be extracted so that three components of corresponding frequency components a to c are extracted from the RF signals REFi (i represents an integer of 1 to n) for reference indicated by a broken line.

Figure 5:
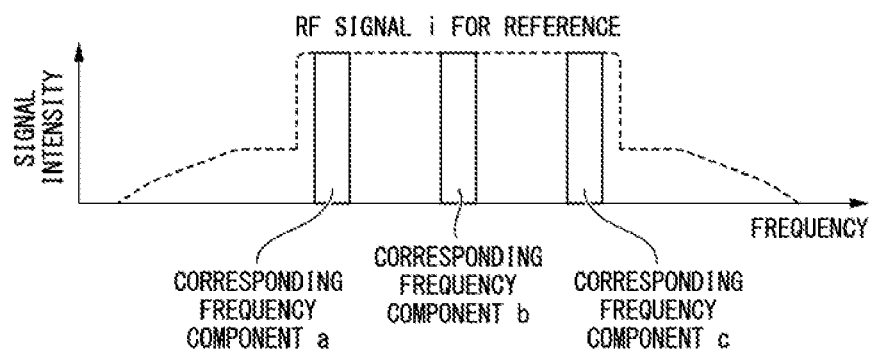
FIG. 5 is a view showing a transmitter according to another exemplary embodiment of the invention.

As shown in FIG. 5, in a case where the frequency selective extraction unit 301 extracts a plurality of frequency components of the RF signal REFi for reference to greatly and evenly cover a frequency axis, the distortion compensation coefficient calculation unit 307 can perform compensation of distortion including asymmetry on the frequency axis and a frequency deviation of a gain due to a memory effect or the like.

In addition, the vertical axis in FIG. 3 and FIG. 5 represents signal intensity, an actual signal also includes phase information, and thus the distortion compensation coefficient calculation unit 307 may perform compensation of distortion including a frequency deviation related to a phase or delay.

In addition, the distortion compensation coefficient calculation unit 307 compares each of the transmission signals SG1 to SGn and a digital signal that is generated by the ADC 306. According to this, a band of the frequency component extracted by the frequency selective extraction unit 301 is demanded to include a signal band of each of the RF signals REF1 to REFn for reference. Note that the bandwidth of the frequency component that is extracted by the frequency selective extraction unit 301 may be optimized on the basis of time taken for calculation of the distortion compensation coefficient, or the like.

Note that in the first exemplary embodiment of the invention, an example in which the orthogonal modulation unit 104a (analog orthogonal modulation unit) is provided in a rear stage of the DAC 103a, and the ADC 306 is provided in a rear stage of the orthogonal demodulation unit 305 (analog orthogonal demodulation unit) is shown. However, in another exemplary embodiment of the invention, the DAC 103a may be provided in a rear stage of a digital orthogonal modulation unit, and a digital orthogonal demodulation unit may be provided in a rear stage of the ADC 306.

Second Exemplary Embodiment

Next, a transmitter 1 according to a second exemplary embodiment of the invention will be described.

Figure 6:
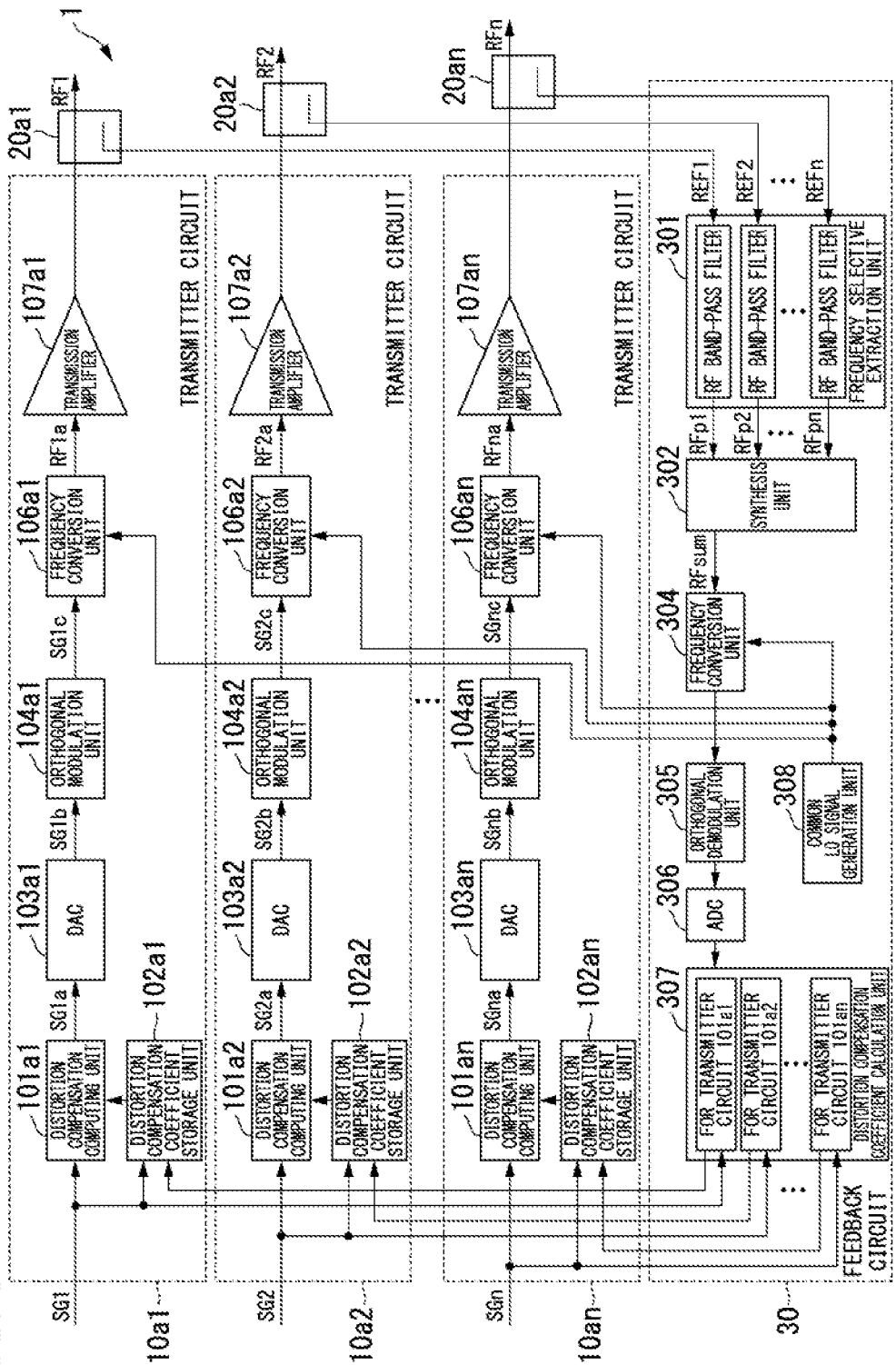
FIG. 6 is a view showing a configuration of a transmitter according to a second exemplary embodiment of the invention.

FIG. 6 is a view showing a configuration of the transmitter 1 according to the second exemplary embodiment of the invention. In the transmitter 1 according to the first exemplary embodiment of the invention, each of the transmitter circuit 10a includes the transmission LO signal generation unit 105a. In addition, the shared feedback circuit 30 includes the feedback LO signal generation unit 303. In comparison to this configuration, as shown in FIG. 6, the transmitter 1 according to the second exemplary embodiment of the invention includes one common LO signal generation unit 308 that is common among each of the transmitter circuits 10a and the shared feedback circuit 30, and the common LO signal generation unit 308 supplies the same LO signal to each of the frequency conversion units 106a and the frequency conversion unit 304.

Hereinbefore, the transmitter 1 according to the second exemplary embodiment of the invention has been described.

The transmitter 1 according to the second exemplary embodiment of the invention includes the common LO signal generation unit 308 instead of the transmission LO signal generation unit 105a and the feedback LO signal generation unit 303 according to the first exemplary embodiment of the invention. LO signals generated by the common LO signal generation unit 308 are signals having the same frequency in a case where each of the transmitter circuits 10a has the same configuration.

In this case, it is possible to further reduce the transmission LO signal generation unit 105a in comparison to the transmitter 1 according to the first exemplary embodiment of the invention.

As a result, in the transmitter 1 which includes the plurality of transmission paths and in which the frequency bands of the RF signals in outputs of the respective transmission paths are the same as each other, it is possible to reduce the cost, a circuit scale, and power consumption.

Note that the common LO signal generation unit 308 shown in FIG. 6 is an example of reducing the number of the LO signal generation units by sharing the transmission LO signal generation unit 105a and the feedback LO signal generation unit 303. The sharing number of the transmission LO signal generation unit 105a and the feedback LO signal generation unit 303, and disposition of the common LO signal generation unit 308 in the case of the sharing can be appropriately changed with reference to the exemplary embodiments of the invention in consideration of a reason related to mounting such as layout of wirings, and other reasons such as synchronization of a phase and phase noise.

Third Exemplary Embodiment

A transmitter 1 according to a third exemplary embodiment of the invention will be described.

Figure 7:
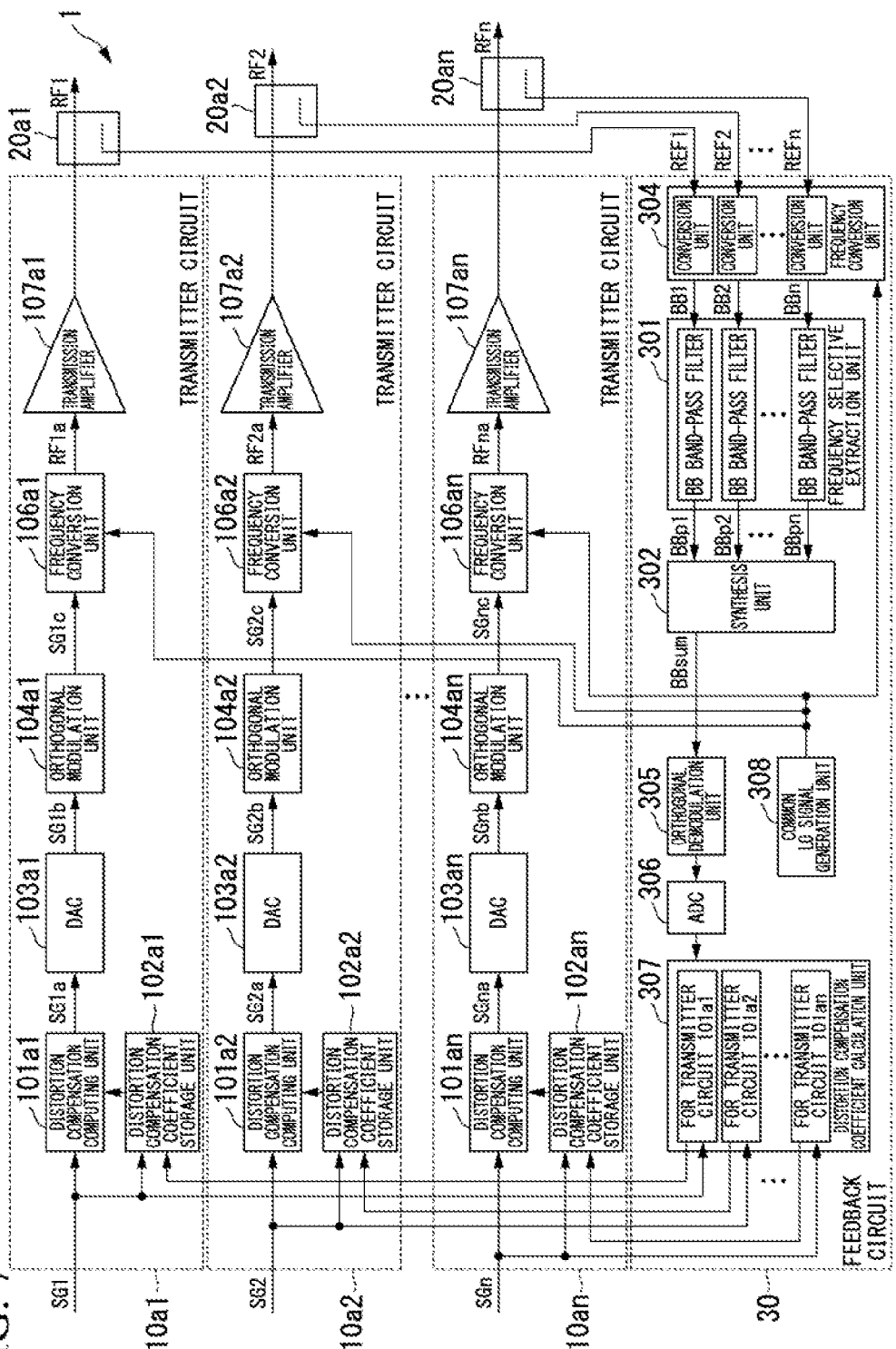
FIG. 7 is a view showing a configuration of a transmitter according to a third exemplary embodiment of the invention.

FIG. 7 is a view showing a configuration of the transmitter 1 according to the third exemplary embodiment of the invention. The transmitters 1 according to the first exemplary embodiment and the second exemplary embodiment of the invention includes the synthesis unit 302 in a rear stage of the frequency selective extraction unit 301 of the shared feedback circuit 30, and the frequency conversion unit 304 in a rear stage of the synthesis unit 302. In comparison to the configuration, as shown in FIG. 7, the transmitter 1 according to the third exemplary embodiment of the invention includes the frequency conversion unit 304 that frequency-converts the RF signals REF1 to REFn for reference into baseband frequency band signals BB (BB1 to BBn). The frequency selective extraction unit 301 includes a BB band-pass filter that allows a frequency component in a passing band that is set among baseband frequency band signals BB to pass therethrough. The synthesis unit 302 synthesizes output signals BBp1 to BBpn of the BB band-pass filter and generates a baseband frequency band signal BB sum. In addition, the transmitter 1 according to the third exemplary embodiment of the invention includes the common LO signal generation unit 308, and the frequency conversion unit 304 independently performs frequency conversion for every RF signal for reference which corresponds to each transmission path by using an LO signal that is supplied from the common LO signal generation unit 308.

The frequency conversion unit 304 outputs baseband frequency band signals BB after the frequency conversion to the frequency selective extraction unit 301.

The frequency selective extraction unit 301 receives the baseband frequency band signals BB which are frequency-converted by the frequency conversion unit 304.

The frequency selective extraction unit 301 allows the received baseband frequency band signals BB after the frequency conversion to pass through the BB band-pass filter, and extracts the baseband frequency band signals BBp1 to BBpn whose frequency components are different from each other according to the BB band-pass filters.

The frequency selective extraction unit 301 outputs the extracted baseband frequency band signals BBp1 to BBpn to the synthesis unit 302.

The synthesis unit 302 receives the baseband frequency band signals BBp1 to BBpn from the frequency selective extraction unit 301.

The synthesis unit 302 multiplexes the received baseband frequency band signals BBp1 to BBpn, and generates one baseband frequency band signal BBsum.

The transmitter 1 according to the third exemplary embodiment of the invention has been described.

In the third exemplary embodiment of the invention, an LO signal for performing frequency conversion with respect to each of the RF signals REF1 to REFn for reference is necessary, but propagation routes of the RF signals REF1 to REFn for reference are independent from each other, and thus it is possible to communize the LO signal in the respective routes, and thus it is possible to reduce the number of LO signal generation units.

As a result, in the transmitter 1 which includes the plurality of transmission paths and in which the frequency bands of the RF signals in outputs of the respective transmission paths are the same as each other, it is possible to reduce the cost, a circuit scale, and power consumption.

In addition, the transmitter 1 according to the third exemplary embodiment of the invention includes the frequency conversion unit 304 that is provided at a front stage of the frequency selective extraction unit 301.

In the first and second exemplary embodiment of the invention, filtering is performed at an RF signal stage, and thus the central frequency of the band-pass filter is raised. Accordingly, an expensive filter such as a wave guide tube filter having a high Q value at a high frequency is necessary to obtain isolation between signals. In addition, filter characteristics are defined with a fractional bandwidth (=bandwidth/central frequency). Therefore, as the central frequency is higher, it is difficult to realize a narrow-band filter, and thus the number of signals capable of being frequency-multiplexed is limited. In contrast, in the third exemplary embodiment of the invention, filtering is performed after frequency conversion into baseband frequency band, and thus it is possible to lower the required performance of the filter. As a result, it is possible to obtain isolation between signals by using an inexpensive band-pass filter. In addition, since the frequency conversion unit 304 performs conversion into a low-frequency signal, and the frequency selective extraction unit 301 selectively extracts the signal, it is possible to lower the central frequency of the band-pass filter. Accordingly, the number of signals capable of being frequency-multiplexed in the third exemplary embodiment of the invention can further increase in comparison to the number of signals capable of being frequency-multiplexed in the first and second exemplary embodiments of the invention.

Accordingly, the transmitter 1 according to the third exemplary embodiment of the invention can further reduce the cost in comparison to the transmitters 1 according to the first and second exemplary embodiment of the invention, and thus it is possible to increase the degree of frequency multiplexing in the shared feedback circuit 30.

Fourth Exemplary Embodiment

A transmitter 1 according to a fourth exemplary embodiment of the invention will be described.

Figure 8:
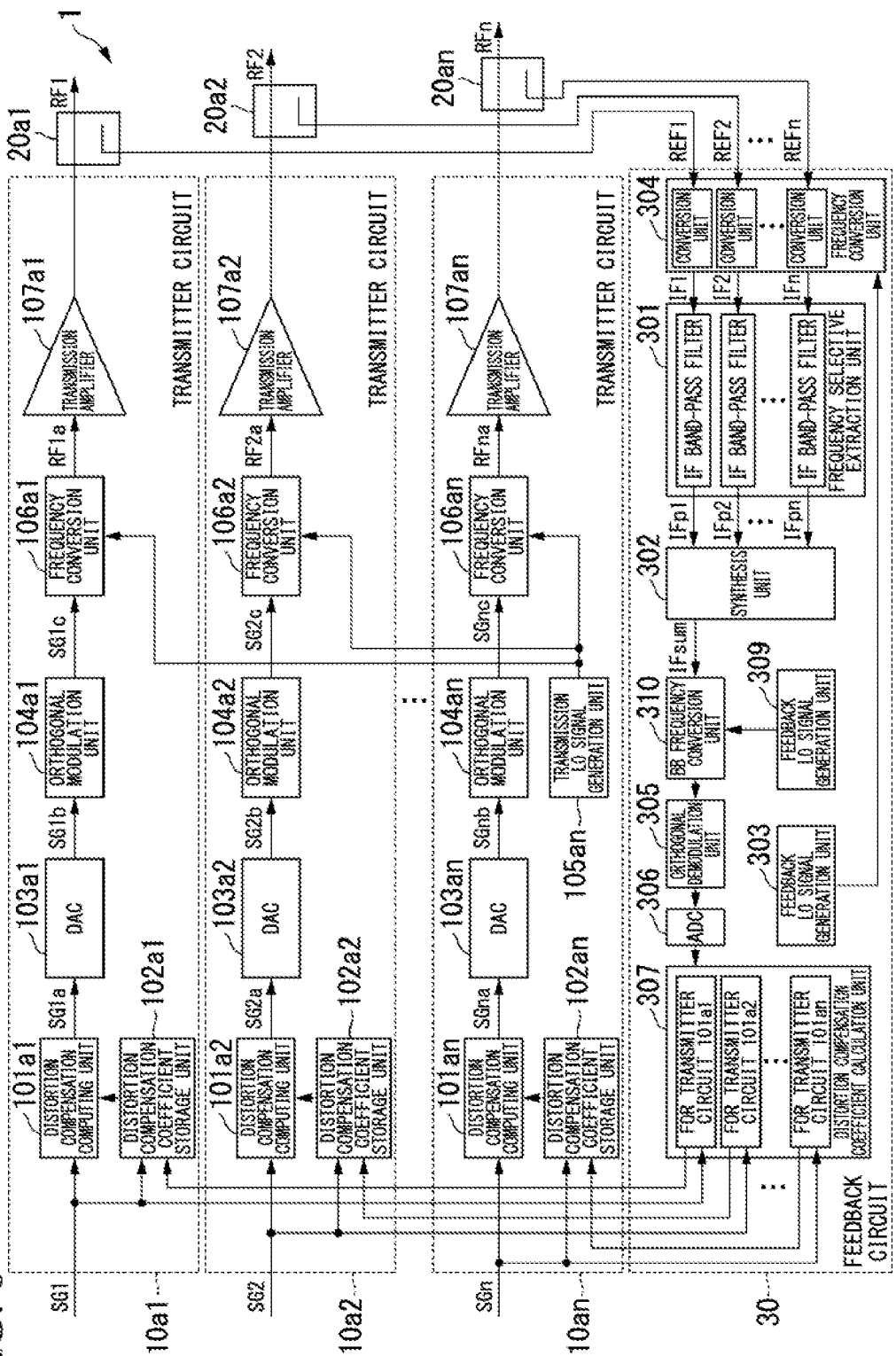
FIG. 8 is a view showing a configuration of a transmitter according to a fourth exemplary embodiment of the invention.

FIG. 8 is a view showing a configuration of the transmitter 1 according to the fourth exemplary embodiment of the invention.

In the first and second exemplary embodiments of the invention, the frequency selective extraction unit 301 processes the RF signals. In addition, in the third exemplary embodiment of the invention, the frequency selective extraction unit 301 processes the baseband signals.

In contrast, in the fourth exemplary embodiment of the invention, as shown in FIG. 8, the transmitter 1 includes a baseband frequency conversion unit 310. In addition, the transmitter 1 according to the fourth exemplary embodiment of the invention includes a frequency conversion unit 304 that frequency-converts the RF signals REF1 to REFn for reference into intermediate frequency band signals IF (IF1 to IFn). The frequency selective extraction unit 301 includes an IF band-pass filter that allows a frequency component in a passing band that is set among the intermediate frequency band signals IF to pass therethrough. The synthesis unit 302 synthesizes output signals IFp1 to IFpn of the IF band-pass filter and generates an intermediate frequency band signal IFsum. The baseband frequency conversion unit 310 converts the IF signal IFsum generated by the synthesis unit 302 into a baseband frequency signal.

According to this, it is possible to use a commercially available surface mount device (SMD) filter such as a surface acoustic wave (SAW) filter and a dielectric substance as the frequency selective extraction unit 301.

Note that the transmitters 1 according to the first to fourth exemplary embodiments of the invention can select installation positions of a processing unit of the RF signals, an intermediate frequency band signal processing unit, a baseband signal processing unit, and the like in correspondence with a device architecture, filter performance, or the like.

For example, in a case where the transmitters 1 use a double-heterodyne type technology, the frequency selective extraction unit 301 processes a signal in a first intermediate frequency band, a second intermediate frequency band, or the like. In addition, in a case where the transmitters 1 use a direct conversion type technology, the frequency selective extraction unit 301 processes RF signals or baseband signals. In addition, in the transmitter 1 shown in FIG. 8, the frequency selective extraction unit 301 is provided between the frequency conversion unit 304 and the synthesis unit 302, and processes intermediate frequency band signals.

The transmitter 1 according to the fourth exemplary embodiment has been described. The transmitter 1 according to the fourth exemplary embodiment of the invention includes the baseband frequency conversion unit 310. In the transmitter 1, the frequency selective extraction unit 301 processes intermediate frequency band signals.

In this case, as the frequency selective extraction unit 301, it is possible to use the commercially available SMD filter such as the SAW filter and the dielectric substance.

Fifth Exemplary Embodiment

A transmitter 1 according to a fifth exemplary embodiment of the invention will be described.

Figure 9:
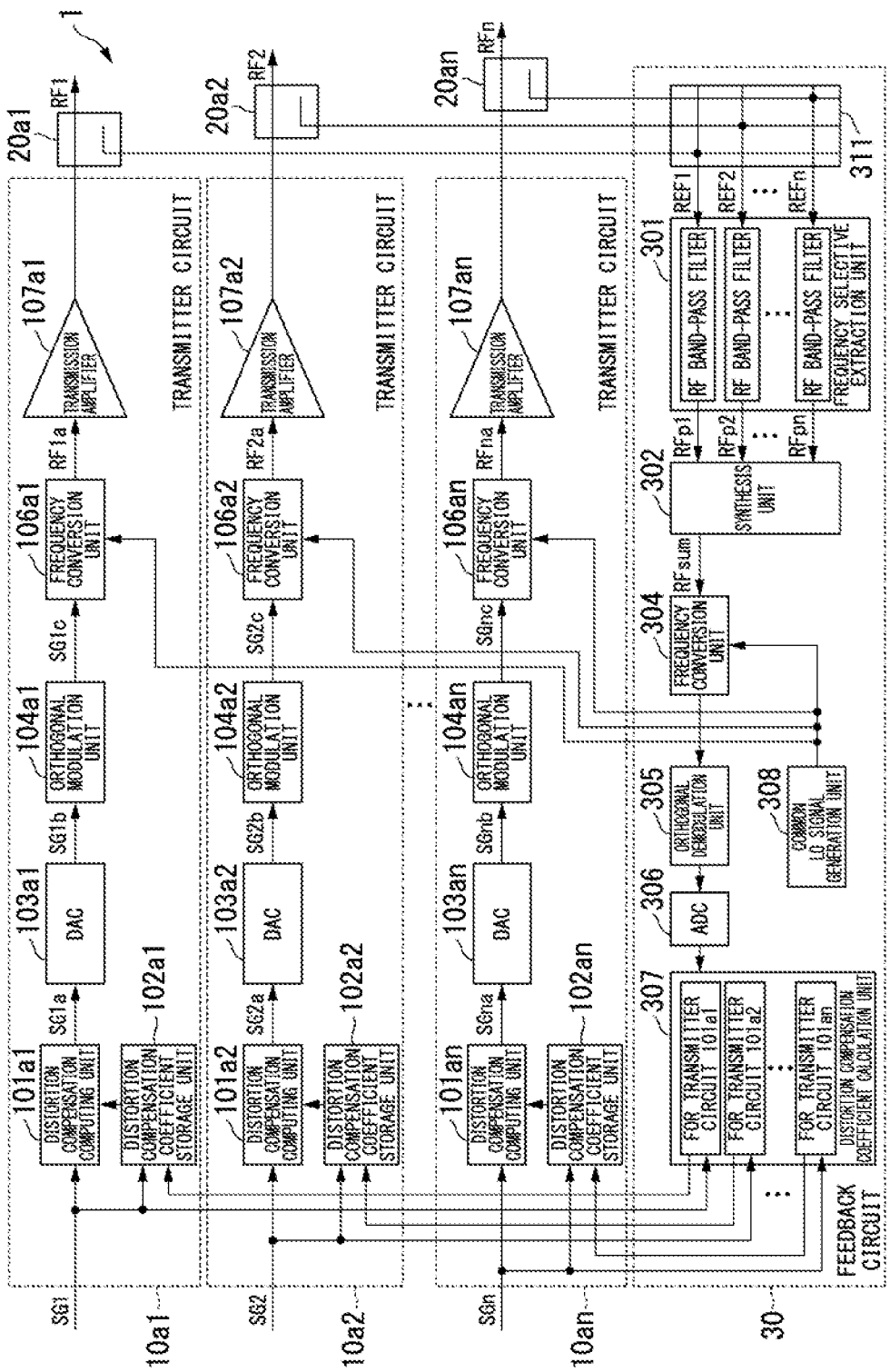
FIG. 9 is a view showing a configuration of a transmitter according to a fifth exemplary embodiment of the invention.

FIG. 9 is a view showing a configuration of the transmitter 1 according to the fifth exemplary embodiment of the invention.

The transmitter 1 according to the fifth exemplary embodiment of the invention is different from the transmitters 1 according to the first to fourth exemplary embodiment of the invention in that a route switching unit 311 that switches a signal route is provided at a front stage of the frequency selective extraction unit 301. In addition, as shown in FIG. 9, a frequency selective extraction unit 301, a synthesis unit 302, and a frequency conversion unit 304 which are provided in the transmitter 1 according to the fifth exemplary embodiment of the invention are the same as the frequency selective extraction unit 301, the synthesis unit 302, and the frequency conversion unit 304 which are provided in the transmitter 1 according to the first exemplary embodiment.

When the distortion compensation coefficient calculation unit 307 repetitively computes the distortion compensation coefficient a plurality of times, the route switching unit 311 can switch frequency components which are extracted from the RF signals REF1 to REFn for reference in the frequency selective extraction unit 301.

The distortion compensation coefficient calculation unit 307 may need to perform a plurality of times of repetitive computation for calculating the distortion compensation coefficient. At this time, the distortion compensation coefficient calculation unit 307 can extract various frequency components due to switching of the signal route, and thus it is possible to perform compensation of distortion including asymmetry on the frequency axis and a frequency deviation of a gain due to a memory effect and the like. In addition, the distortion compensation coefficient calculation unit 307 can quicken convergence in calculation of the distortion compensation coefficient.

Note that signal routes for the RF signals REF1 to REFn for reference and n pieces of signal routes in the frequency selective extraction unit 301 are connected to the route switching unit 311, and thus it is demanded to use a switch capable of realizing n×n cross-connections.

In addition, in any time zone in time-division processing, first to $m^{th}$ (1<m<n) routes among routes of the RF signals REF1 to REFn for reference are connected to first to $m^{th}$ routes in the frequency selective extraction unit 301, and the distortion compensation coefficient calculation unit 307 calculates the distortion compensation coefficient. In addition, in a next time zone, the remaining $(m+1)^{th}$ to $n^{th}$ routes are connected to $(m+1)^{th}$ to $n^{th}$ routes in the frequency selective extraction unit 301, and the distortion compensation coefficient calculation unit 307 calculates the distortion compensation coefficient. As described above, the distortion compensation coefficient calculation unit 307 can further combine time-division processing to the distortion compensation processing in which frequency are multiplexed. In this case, a switch capable of realizing n×m cross-connections may be used. According to this, it is possible to reduce the scale of the shared feedback circuit 30, and thus it is possible to further reduce the cost, a circuit scale, and power consumption of the transmitter 1.

Note that it is demanded to perform switching by the route switching unit 311 in accordance with a table that is determined in advance. According to this, a relationship between a switching result of the route switching unit 311 and a frequency component extracted from the RF signals REF1 to REFn for reference which are determined along with the switching result becomes clear. Accordingly, when the distortion compensation coefficient calculation unit 307 calculates the distortion compensation coefficient in advance, a procedure of a method of taking a frequency component with satisfactory convergence, and the like can be programmed in advance.

The transmitter 1 according to the fifth exemplary embodiment of the invention has been described.

The transmitter 1 according to the fifth exemplary embodiment of the invention includes the route switching unit 311.

The route switching unit 311 switches routes corresponding to frequency bands of different-band signals.

In this case, the route switching unit 311 can appropriately switch frequency components extracted from the RF signals REF1 to REFn for reference in the frequency selective extraction unit 301.

As a result, the distortion compensation coefficient calculation unit 307 can further combine time-division processing to the distortion compensation processing in which frequency are multiplexed, and thus it is possible to further reduce the cost, a circuit scale, and power consumption of the transmitter 1.

Sixth Exemplary Embodiment

A transmitter 1 according to a sixth exemplary embodiment of the invention will be described.

Figure 10:
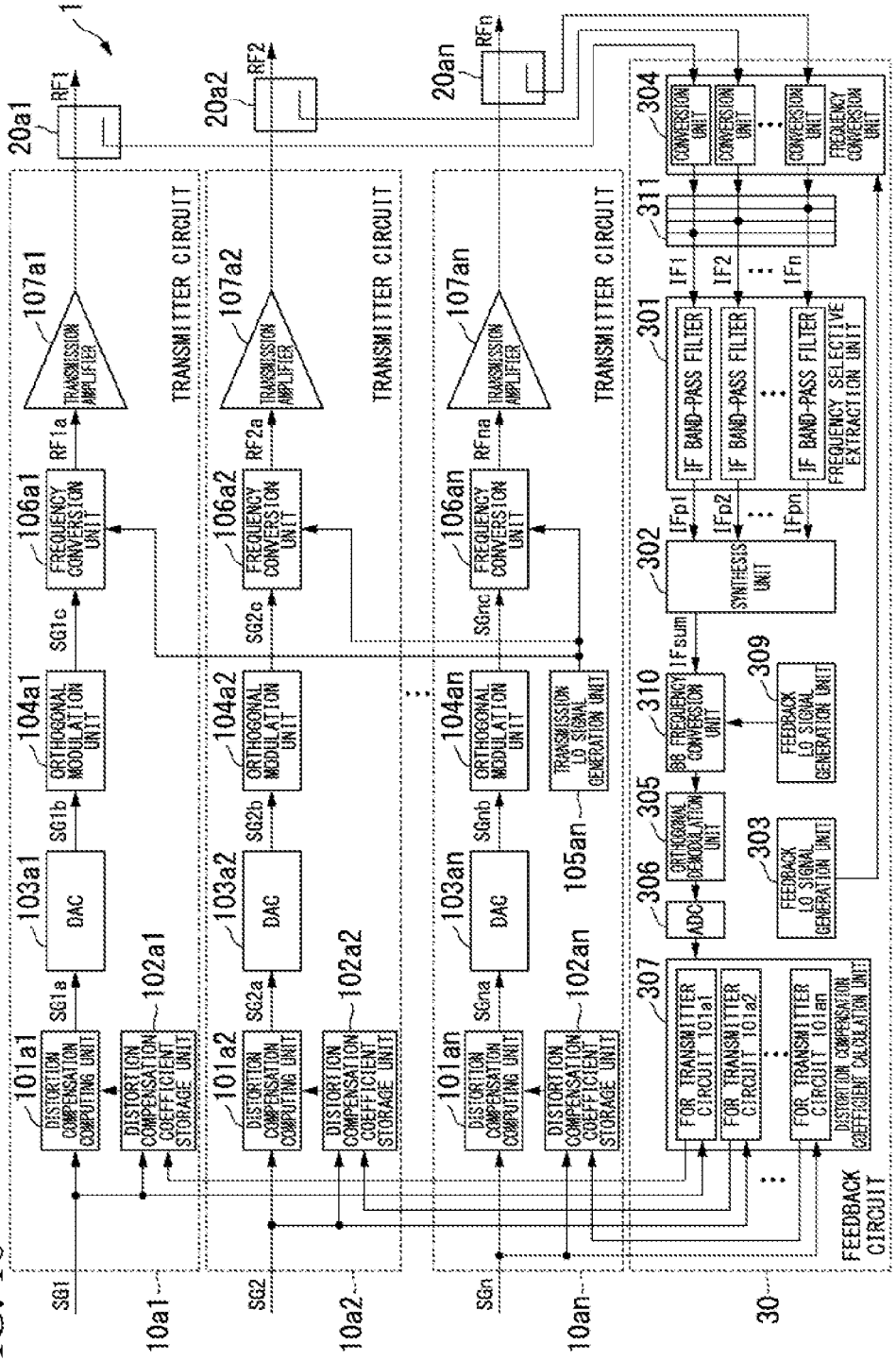
FIG. 10 is a view showing a configuration of a transmitter according to a sixth exemplary embodiment of the invention.

FIG. 10 is a view showing a configuration of the transmitter 1 according to the sixth exemplary embodiment of the invention.

The transmitter 1 according to the sixth exemplary embodiment of the invention is different from the transmitter 1 according to the fifth exemplary embodiment of the invention in that the route switching unit 311 is provided in the intermediate frequency band signal processing unit. In addition, the frequency selective extraction unit 301 includes an IF band-pass filter that allows signals (IF1 to IFn) in an intermediate frequency band to pass therethrough. The synthesis unit 302 synthesizes the intermediate frequency band signals (IF1 to IFn) and generates an intermediate frequency band signal IFsum. The baseband frequency conversion unit 310 converts the intermediate frequency band signal IFsum into baseband frequency signal. The route switching unit 311 according to the sixth exemplary embodiment of the invention can appropriately switch frequency components extracted from intermediate frequency band signals for reference which are frequency-converted by the frequency conversion unit 304.

A plurality of times of repetitive computation may be necessary for the distortion compensation coefficient calculation unit 307 in calculation of the distortion compensation coefficient. At this time, the distortion compensation coefficient calculation unit 307 can extract various frequency components due to switching of the signal route, and thus it is possible to perform compensation of distortion including asymmetry on the frequency axis and a frequency deviation of a gain due to a memory effect and the like. In addition, the distortion compensation coefficient calculation unit 307 can quicken convergence in calculation of the distortion compensation coefficient.

Note that signal routes for IF signals IF1 to IFn for reference and n pieces of signal routes in the frequency selective extraction unit 301 are connected to the route switching unit 311, and thus it is demanded to use a switch capable of realizing n×n cross-connections.

In addition, in any time zone in time-division processing, first to $m^{th}$ (1<m<n) routes among routes of the reference IF signals IF1 to IFn are connected to first to $m^{th}$ routes in the frequency selective extraction unit 301, and the distortion compensation coefficient calculation unit 307 calculates the distortion compensation coefficient. In addition, in a next time zone, the remaining $(m+1)^{th}$ to $n^{th}$ routes are connected to $(m+1)^{th}$ to $n^{th}$ routes in the frequency selective extraction unit 301, and the distortion compensation coefficient calculation unit 307 calculates the distortion compensation coefficient. As described above, the distortion compensation coefficient calculation unit 307 can further combine time-division processing to the distortion compensation processing in which frequency are multiplexed. In this case, a switch capable of realizing n×m cross-connections may be used. According to this, it is possible to reduce the scale of the shared feedback circuit 30, and thus it is possible to further reduce the cost, the circuit scale, and the power consumption of the transmitter 1.

Note that it is demanded to perform switching by the route switching unit 311 in accordance with a table that is determined in advance. According to this, a relationship between a switching result of the route switching unit 311 and a frequency component extracted from the IF signals IF1 to IFn for reference which are determined along with the switching result becomes clear. Accordingly, when the distortion compensation coefficient calculation unit 307 calculates the distortion compensation coefficient in advance, a procedure of a method of taking a frequency component with satisfactory convergence, and the like can be programmed.

Figure 11:
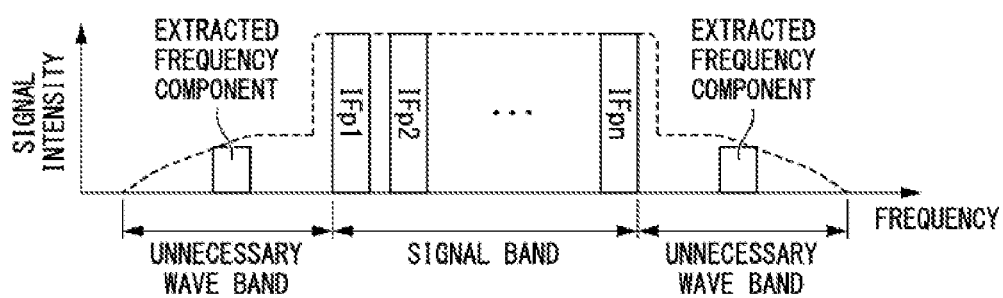
FIG. 11 is a view showing the transmitter according to the sixth exemplary embodiment of the invention.

In addition, as shown in FIG. 11, a frequency component, which includes a distortion component that occurs mainly in the transmission amplifier 107a as a main component, of an unnecessary wave band corresponding to a band different from a signal band may be included in the frequency component that is extracted from the IF signals IF1 to IFn for reference as an extraction frequency component. In the region, a signal component may be regarded as zero, and thus it is possible to simplify processing in calculation of the distortion compensation coefficient.

The transmitter 1 according to the sixth exemplary embodiment of the invention has been described.

The transmitter 1 according to the sixth exemplary embodiment of the invention includes the route switching unit 311 in the intermediate frequency band signal processing unit.

The route switching unit 311 switches routes corresponding to frequency bands of different-band signals.

In this case, it is possible to appropriately switch frequency components which are extracted from intermediate frequency band signals for reference which are frequency-converted by the frequency conversion unit 304.

As a result, the distortion compensation coefficient calculation unit 307 can further combine time-division processing to the distortion compensation processing in which frequency are multiplexed, and thus it is possible to further reduce the cost, the circuit scale, and the power consumption of the transmitter 1.

Seventh Exemplary Embodiment

A transmitter 1 according to a seventh exemplary embodiment of the invention will be described.

Figure 12:
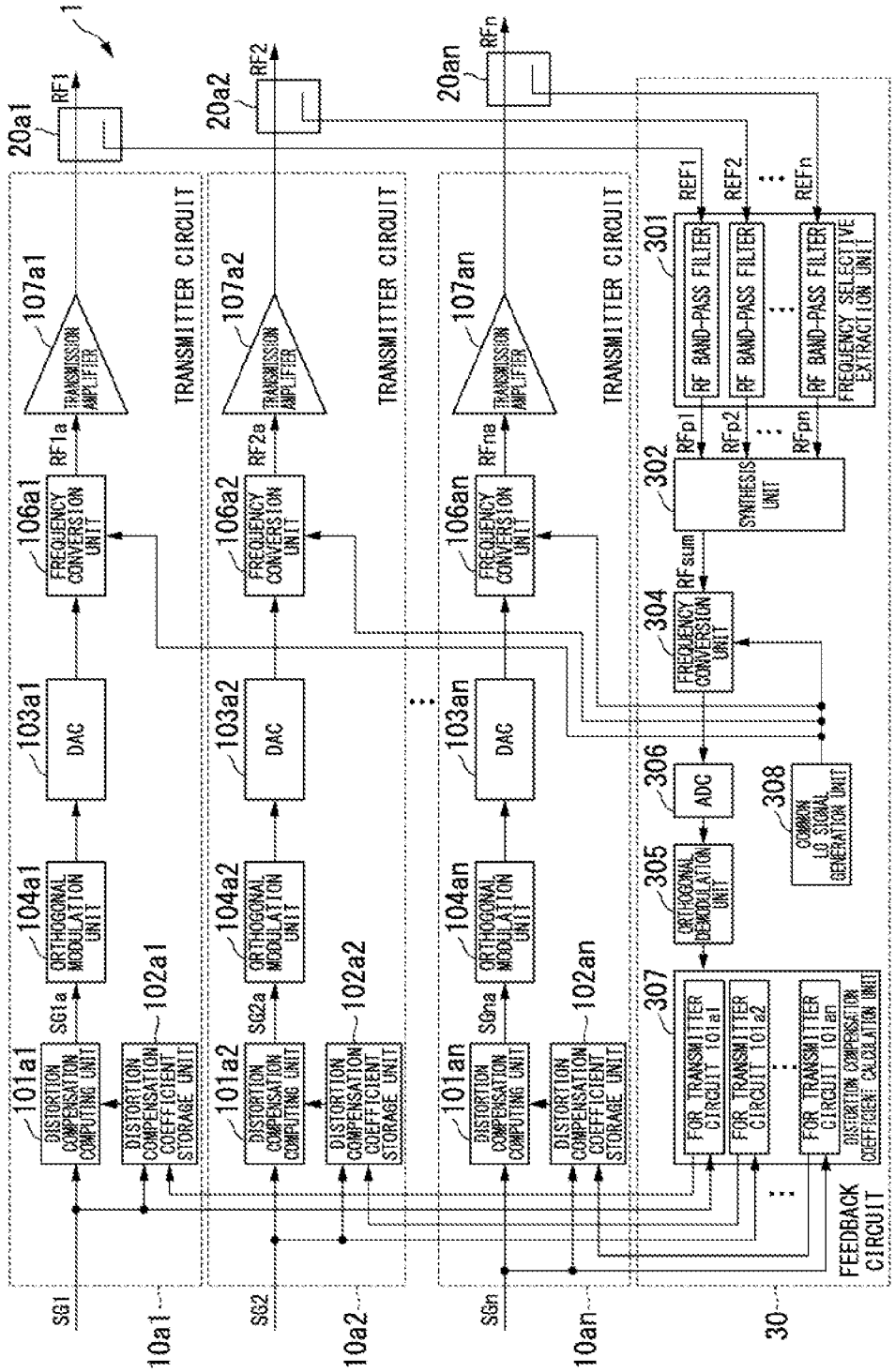
FIG. 12 is a view showing a configuration of a transmitter according to a seventh exemplary embodiment of the invention.

FIG. 12 is a view showing a configuration of the transmitter 1 according to the seventh exemplary embodiment of the invention.

In the transmitter 1 according to the seventh exemplary embodiment of the invention, the DAC 103a and the orthogonal modulation unit 104a in the transmitter 1 according to the second exemplary embodiment of the invention are switched from each other, and the ADC 306 and the orthogonal demodulation unit 305 are switched from each other.

In this case, the transmitter 1 can use a direct conversion type technology or a direct IF sampling type technology.

The technologies are appropriately selected in accordance with architecture of the transmitter 1.

Next, the transmitter 1 with a minimum configuration according to an exemplary embodiment of the invention will be described.

The transmitter 1 with a minimum configuration according to the exemplary embodiment of the invention is a transmitter which includes a plurality of transmission paths and in which frequency bands of RF signals in outputs of the transmission paths are the same as each other.

Figure 13:
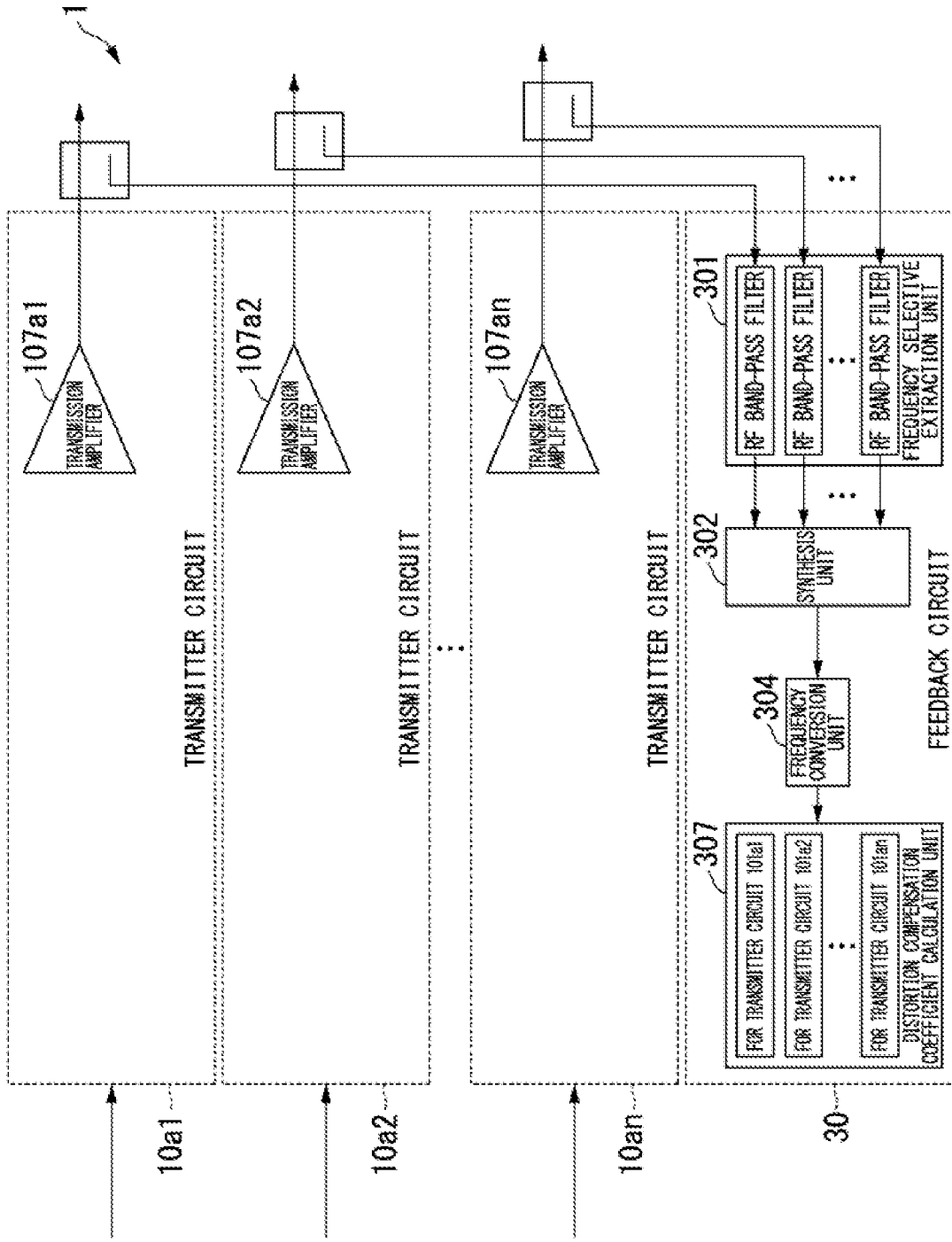
FIG. 13 is a view showing a minimum configuration of the transmitters of the exemplary embodiments of the invention.

As shown in FIG. 13, the transmitter 1 includes a plurality of transmitter circuits 10a and a feedback circuit 30 that is shared by the plurality of transmitter circuits 10a.

The plurality of transmitter circuits 10a generate signals having the same frequency band.

The feedback circuit 30 that is shared by the plurality of transmitter circuits 10a feeds back a part of a transmission amplification signal that is output from each of the plurality of transmitter circuits 10a through the transmission amplifier 107a to a corresponding transmitter circuit 10a, which outputs the transmission amplification signal, among the plurality of transmitter circuits 10a.

The feedback circuit 30 includes a frequency selective extraction unit 301, a synthesis unit 302, a frequency conversion unit 304, and a distortion compensation coefficient calculation unit 307.

The frequency selective extraction unit 301 extracts different-band signals in frequency bands, which different from each other, of the transmission amplification signal.

The synthesis unit 302 synthesizes the different-band signals extracted by the frequency selective extraction unit 301, and generates a synthesis signal.

The frequency conversion unit 304 frequency-converts the synthesis signal generated by the synthesis unit 302 by using a local signal that is common to transmission paths of the same frequency.

The distortion compensation coefficient calculation unit 307 calculates the distortion compensation coefficient that is used when compensating for distortion of signals in outputs of the plurality of transmitter circuits 10a on the basis of the different-band signals.

Eighth Exemplary Embodiment

A transceiver according to an eighth exemplary embodiment of the invention will be described.

Figure 14:
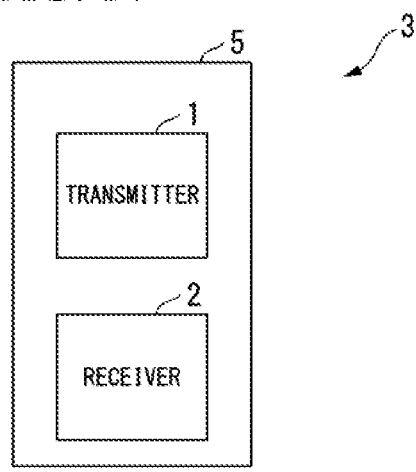
FIG. 14 is a view showing a configuration of a transmitter according to an eighth exemplary embodiment of the invention.

FIG. 14 is a view showing a configuration of a transceiver 3 according to the eighth exemplary embodiment of the invention.

As shown in FIG. 14, the transceiver 3 according to the eighth exemplary embodiment of the invention includes a housing 5, a transmitter 1, and a receiver 2.

The transmitter 1 is any one transmitter among the transmitters 1 according to the exemplary embodiments of the invention.

The receiver 2 is one receiver that receives a communication signal that is transmitted from a communication device different from the transmitter 1.

The one transmitter 1 and the one receiver 2 are accommodated in the housing 5 that is provided in the transceiver 3.

The transceiver 3 performs communication with a communication device different from the transceiver 3 by the transmitter 1 and the receiver 2 which are accommodated in the housing 5.

Next, a communication system 4 including any one of the transmitters 1 according to the exemplary embodiments of the invention.

Figure 15:
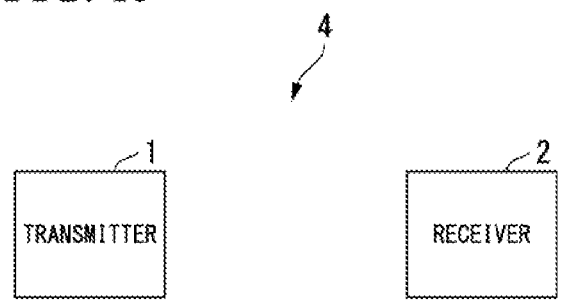
FIG. 15 is a first view showing a configuration example of a communication system according to the exemplary embodiments of the invention.

For example, as shown in FIG. 15, the communication system 4 according to an exemplary embodiment of the invention includes the transmitter 1 and the receiver 2.

The transmitter 1 is any one of the transmitters 1 according to the first to seventh exemplary embodiment of the invention, and a modification thereof. In addition, the receiver 2 is a receiver including a receiving unit that receives a transmission signal transmitted from the transmitter 1 according to this exemplary embodiment.

In this case, in the transmitter 1 which includes a plurality of transmission paths and in which frequency bands of RF signals in outputs of the transmission paths are the same as each other, it is possible to reduce a circuit scale.

Figure 16:
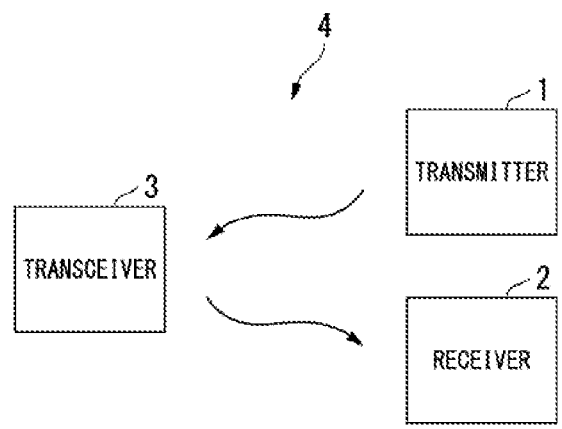
FIG. 16 is a second view showing a configuration example of the communication system according to the exemplary embodiments of the invention.

In addition, for example, as shown in FIG. 16, the communication system 4 according to the exemplary embodiment of the invention may include the transceiver 3 and at least one of the transmitter 1 and the receiver 2.

The transceiver 3 is any one of the transceiver 3 according to the eighth exemplary embodiment of the invention and a modification thereof. In addition, the transmitter 1 is a communication device that transmits a communication signal to the transceiver 3. In addition, the receiver 2 is a communication device that receives a transmission amplification signal that is transmitted from the transceiver 3.

In a case where the transmitter 1 transmits the communication signal to the transceiver 3, in the transmitter 1 which includes a plurality of transmission paths and in which frequency bands of RF signals in outputs of the transmission paths are the same each other, it is possible to reduce a circuit scale.

In addition, in a case where the transceiver 3 transmits the transmission amplification signal to the receiver 2, in the transmitter 1 which includes a plurality of transmission paths provided in the transceiver 3, and in which frequency bands of RF signals in outputs of the transmission paths are the same as each other, it is possible to reduce a circuit scale.

Note that with regard to processing in the exemplary embodiments of the invention, a procedure of the processing may be changed in a range in which appropriate processing is performed.

Each of the storage units in the exemplary embodiments of the invention may be provided in any site in a range in which transmission and receiving of appropriate information are performed. In addition, with regard to each of the storage units, a plurality of storage units may exist and may store data in a dispersed manner in a range in which appropriate information transmission and receiving are performed.

The exemplary embodiments of the invention have been described, but the frequency control unit 210a or other control units may include a computer system on an inner side. In addition, the course of the processing described above is stored in a computer-readable recording medium in a program format, and the processing is performed when a computer reads and executes the program. Here, the computer-readable recording medium represents a magnetic disk, a magneto-optical disc, a CD-ROM, a DVD-ROM, a semiconductor memory, and the like. In addition, the computer program may be transferred to the computer through a communication line, and the computer to which the program is transferred may execute the program.

In addition, the program may realize a part of the above-described functions. In addition, the program may be a file that can realize the above-described functions in a combination with a program that is recorded in a computer system in advance, that is, a so-called differential file (differential program).

Several exemplary embodiments of the invention have been described, but these exemplary embodiments are illustrative only and do not limit the scope of the invention. Addition, various emissions, substitutions, and modifications may be made with respect to the exemplary embodiments in a range not departing from the gist of the invention.

INDUSTRIAL APPLICABILITY

According to the above-described transmitters, in a transmitter which includes a plurality of transmission paths and in which frequency bands of RF signals in outputs of the transmission paths are the same as each other, it is possible to reduce a circuit scale.

REFERENCE SIGNS LIST

1 Transmitter
2 Receiver

3 Transceiver
4 Communication system
5 Housing
10a, 10a1, 10a2, 10an Transmitter circuit
20a, 20a1, 20a2, 20an Signal branching unit
30 Feedback circuit
101a, 101a1, 101a2, 101an Distortion compensation computing unit
102a, 102a1, 102a2, 102an Distortion compensation coefficient storage unit
103a, 103a1, 103a2, 103an Digital to analog converter (DAC)
104a, 104a1, 104a2, 104an Orthogonal modulation unit
105a, 105a1, 105a2, 105an Transmission LO signal generation unit
106a, 106a1, 106a2, 106an, 304 Frequency conversion unit
107a, 107a1, 107a2, 107an Transmission amplifier
301 Frequency selective extraction unit
302 Synthesis unit
303, 309 Feedback LO signal generation unit
305 Orthogonal demodulation unit
306 Analog to digital converter (ADC)
307 Distortion compensation coefficient calculation unit
308 Common LO signal generation unit
310 Baseband frequency conversion unit
311 Route switching unit

The invention claimed is:

1. A transmitter comprising:
a plurality of transmitter circuits configured to generate signals that are within a same frequency band; and
a feedback circuit that is shared by the plurality of transmitter circuits, the feedback circuit being configured to feed back a part of a first transmission amplification signal to a transmitter circuit, the first transmission amplification signal being output from each of the plurality of transmitter circuits through a transmission amplifier, and the transmitter circuit being configured to output the first transmission amplification signal among the plurality of transmitter circuits,
wherein the feedback circuit is configured to:
extract different-band signals in frequency bands from the first transmission amplification signal, the frequency bands being different from each other,
synthesize the different-band signals and generate a synthesis signal,
convert a frequency of the synthesis signal by using a single-band local signal, the local signal being common to a plurality of transmission paths, and
calculate a distortion compensation coefficient based on signals of frequency bands of the different-band signals, the distortion compensation coefficient being used when compensating for distortion of signals in outputs of the plurality of transmitter circuits.

2. The transmitter according to claim 1,
wherein the feedback circuit is further configured to switch routes corresponding to the frequency bands of the different-band signals.

3. The transmitter according to claim 1,
wherein the feedback circuit includes a guard band.

4. A transceiver comprising:
the transmitter according to claim 1;
a receiver; and
a housing in which the transmitter and the receiver are accommodated,
wherein the receiver is configured to receive a second transmission amplification signal that is transmitted from another transmitter.

5. A communication system comprising:
the transmitter according to claim 1; and
a receiver configured to receive the first transmission amplification signal that is transmitted from the transmitter.

6. A communication system comprising:
the transceiver according to claim 4, the transceiver including one or more transceivers; and
the transceiver configured to execute at least any one of:
receiving of the first transmission amplification signal; and
transmission of a third transmission amplification signal to the one or more transceiver.

7. A control method of a transmitter, comprising:
generating signals that are within a same frequency band;
feeding back a part of a transmission amplification signal to a transmitter circuit, the transmission amplification signal being output from each of a plurality of transmitter circuits through a transmission amplifier, the plurality of the transmitter circuits including the transmitter circuit, and the transmitter circuit being configured to output the transmission amplification signal among the plurality of transmitter circuits;
extracting different-band signals of frequency bands from the transmission amplification signal, the frequency bands being different from each other;
synthesizing the extracted different-band signals and generating a synthesis signal;
converting a frequency of the synthesis signal that is generated by using a single-band local signal, the local signal being common to a plurality of transmission paths; and
calculating a distortion compensation coefficient based on signals of frequency bands of the different-band signals, the distortion compensation coefficient being used when compensating for distortion of signals in outputs of the plurality of transmitter circuits.

8. A non-transitory computer-readable recording medium storing a program that causes a computer of a transmitter including a plurality of transmission paths to execute:
generating signals that are within a same frequency band;
feeding back a part of a transmission amplification signal to a transmitter circuit, the transmission amplification signal being output from each of a plurality of transmitter circuits through a transmission amplifier, the plurality of the transmitter circuits including the transmitter circuit, and the transmitter circuit being configured to output the transmission amplification signal among the plurality of transmitter circuits;
extracting different-band signals of frequency bands from the transmission amplification signal, the frequency bands being different from each other;
synthesizing the extracted different-band signals and generating a synthesis signal;
converting a frequency of the synthesis signal that is generated by using a single-band local signal, the local signal being common to a plurality of transmission paths; and
calculating a distortion compensation coefficient based on signals of frequency bands of the different-band signals, the distortion compensation coefficient being used when compensating for distortion of signals in outputs of the plurality of transmitter circuits.

* * * * *